(12) United States Patent
Teh et al.

(10) Patent No.: US 12,614,136 B2
(45) Date of Patent: Apr. 28, 2026

(54) PLAN DEVIATIONS VISUALIZATION AND INTERPRETATION

(71) Applicant: Schlumberger Technology Corporation, Sugar Land, TX (US)

(72) Inventors: Siau Ban Teh, Menlo Park, CA (US); Vladimir Zhernakov, Menlo Park, CA (US)

(73) Assignee: Schlumberger Technology Corporation, Sugar Land, TX (US)

( * ) Notice: Subject to any disclaimer, the term of this patent is extended or adjusted under 35 U.S.C. 154(b) by 446 days.

(21) Appl. No.: 17/250,884

(22) PCT Filed: Sep. 18, 2019

(86) PCT No.: PCT/US2019/051735
§ 371 (c)(1),
(2) Date: Mar. 19, 2021

(87) PCT Pub. No.: WO2020/061195
PCT Pub. Date: Mar. 26, 2020

(65) Prior Publication Data
US 2021/0374638 A1 Dec. 2, 2021

Related U.S. Application Data

(60) Provisional application No. 62/733,575, filed on Sep. 19, 2018.

(51) Int. Cl.
*G06Q 10/06* (2023.01)
*E21B 41/00* (2006.01)
(Continued)

(52) U.S. Cl.
CPC ....... *G06Q 10/06313* (2013.01); *E21B 41/00* (2013.01); *G06F 30/20* (2020.01);
(Continued)

(58) Field of Classification Search
None
See application file for complete search history.

(56) References Cited

U.S. PATENT DOCUMENTS 8,036,872 B2 * 10/2011 Nasle .................... G06F 30/20
703/2
8,775,347 B2 * 7/2014 Goel .................... G06Q 10/06
706/46

(Continued)

OTHER PUBLICATIONS

International Search Report and the Written Opinion of International Application No. PCT/US2019/051735 dated Apr. 2, 2020.
(Continued)

*Primary Examiner* — Arif Ullah
(74) *Attorney, Agent, or Firm* — Jeffrey D. Frantz

(57) ABSTRACT
A method for conducting an oilfield operation includes obtaining a plan for conducting an oilfield operation, the plan including a planned value for a metric, receiving data collected while performing one or more oilfield activities using the plan, at least a portion of the data representing an actual value for the metric, determining that one or more deviations from the plan occurred based on a difference between the actual value and the planned value, identifying one or more unplanned events of the one or more oilfield activities that are not in the plan that caused the one or more deviations, calculating a contribution to the difference between the actual value and the planned value caused by the one or more unplanned events, and modifying the plan to account for the one or more unplanned events.

19 Claims, 6 Drawing Sheets

(51) Int. Cl.

| | |
|---|---|
| *G06F 30/20* | (2020.01) |
| *G06Q 10/0631* | (2023.01) |
| *G06Q 10/0637* | (2023.01) |
| *G06Q 10/0639* | (2023.01) |
| *G06Q 50/02* | (2012.01) |
| *G06Q 10/067* | (2023.01) |
| *G06Q 10/10* | (2023.01) |

(52) U.S. Cl.

CPC ..... *G06Q 10/0637* (2013.01); *G06Q 10/0639* (2013.01); *G06Q 50/02* (2013.01); *E21B 2200/20* (2020.05); *G06Q 10/067* (2013.01); *G06Q 10/103* (2013.01)

(56) References Cited

U.S. PATENT DOCUMENTS

| | | | | |
|---|---|---|---|---|
| 9,638,830 | B2 | 5/2017 | Meyer et al. | |
| 2005/0096893 | A1* | 5/2005 | Feraille | G06Q 10/04 703/10 |
| 2007/0156377 | A1* | 7/2007 | Gurpinar | E21B 49/00 703/10 |
| 2009/0076873 | A1* | 3/2009 | Johnson | G06Q 10/06 705/7.28 |
| 2009/0157367 | A1* | 6/2009 | Meyer | G01V 99/005 703/10 |
| 2009/0299636 | A1* | 12/2009 | Carnegie | E21B 47/00 702/6 |
| 2011/0161133 | A1* | 6/2011 | Staveley | E21B 44/00 705/7.11 |
| 2012/0054246 | A1* | 3/2012 | Fischer | G06Q 10/0833 707/E17.044 |
| 2013/0231787 | A1* | 9/2013 | Chapman | E21B 44/00 700/282 |
| 2014/0257526 | A1 | 9/2014 | Tiwari et al. | |
| 2015/0278734 | A1* | 10/2015 | Grant | G06Q 10/06313 705/7.23 |
| 2016/0097270 | A1 | 4/2016 | Pobedinski et al. | |
| 2018/0012310 | A1* | 1/2018 | Fox | E21B 44/00 |
| 2021/0166322 | A1* | 6/2021 | Allen | G06Q 40/08 |

OTHER PUBLICATIONS

International Preliminary Report on Patentability of the equivalent PCT/US2019/051735 dated Apr. 1, 2021.

* cited by examiner

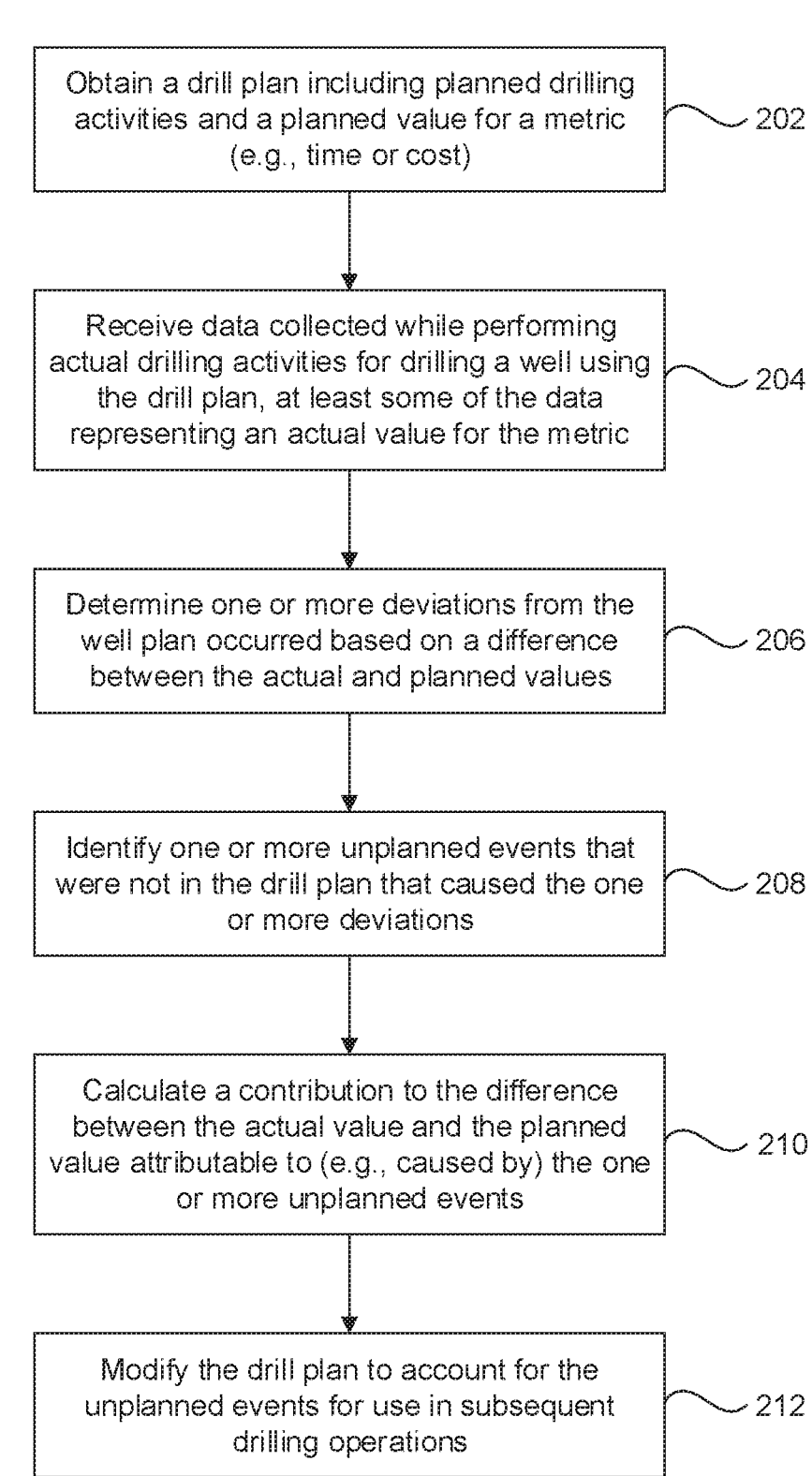

200

Obtain a drill plan including planned drilling activities and a planned value for a metric (e.g., time or cost) ⟿ 202

Receive data collected while performing actual drilling activities for drilling a well using the drill plan, at least some of the data representing an actual value for the metric ⟿ 204

Determine one or more deviations from the well plan occurred based on a difference between the actual and planned values ⟿ 206

Identify one or more unplanned events that were not in the drill plan that caused the one or more deviations ⟿ 208

Calculate a contribution to the difference between the actual value and the planned value attributable to (e.g., caused by) the one or more unplanned events ⟿ 210

Modify the drill plan to account for the unplanned events for use in subsequent drilling operations ⟿ 212

FIG. 2

PLAN DEVIATIONS VISUALIZATION AND INTERPRETATION

CROSS-REFERENCE TO RELATED APPLICATIONS

This application is a National Stage entry of International Patent Application No. PCT/US2019/051735, filed on Sep. 18, 2019, which claims priority to U.S. Provisional Patent Application having Ser. No. 62/733,575, which was filed on Sep. 19, 2018, and is incorporated herein by reference in its entirety.

BACKGROUND

In the oil and gas industry, details of a well, including its location, trajectory, geometry, and the like are planned prior to the commencement of drilling as part of a well or drill plan. The data for the drill plan is gleaned from a variety of sources, including the drilling logs of nearby ("offset") wells that have been drilled previously, along with seismic information and other exploration data sources. Once the drill plan is crafted, it is provided to a driller, who implements it.

However, drilling does not always proceed fully according to plan, and unexpected events, conditions, etc., can arise that result in deviations from the plan. Further, the well engineers who design the drill plan and operation engineers who execute the plan may not be able to easily communicate with one another. This can lead to a failure to capture experiential data acquired during drilling that may help with crafting more accurate drill plans in the future. Generally, if the well engineer wants to learn more about the delivered well plan, the well engineer has to manually receive data from operation, and then manually display the data on software available to them.

SUMMARY

A method for conducting an oilfield operation is disclosed. The method includes obtaining a plan for conducting an oilfield operation, the plan including a planned value for a metric, receiving data collected while performing one or more oilfield activities using the plan, at least a portion of the data representing an actual value for the metric, determining that one or more deviations from the plan occurred based on a difference between the actual value and the planned value, identifying one or more unplanned events of the one or more oilfield activities that are not in the plan that caused the one or more deviations, calculating a contribution to the difference between the actual value and the planned value caused by the one or more unplanned events, and modifying the plan to account for the one or more unplanned events.

A non-transitory computer-readable medium is also disclosed. The medium stores instructions that, when executed by one or more processors of a computing system, cause the computing system to perform operations. The operations include obtaining a plan for conducting an oilfield operation, the plan including a planned value for a metric, receiving data collected while performing one or more oilfield activities using the plan, at least a portion of the data representing an actual value for the metric, determining that one or more deviations from the plan occurred based on a difference between the actual value and the planned value, identifying one or more unplanned events of the one or more oilfield activities that are not in the plan that caused the one or more deviations, calculating a contribution to the difference between the actual value and the planned value caused by the one or more unplanned events, and modifying the plan to account for the one or more unplanned events.

A computing system is further disclosed. The computing system includes one or more processors, and a memory system including one or more non-transitory, computer-readable media storing instructions that, when executed by at least one of the one or more processors, cause the computing system to perform operations. The operations include obtaining a drill plan for drilling a well, the drill plan including a planned value for a metric, receiving data collected while performing one or more drilling activities using the drill plan, at least a portion of the data representing an actual value for the metric, determining that one or more deviations from the plan occurred based on a difference between the actual value and the planned value, identifying one or more unplanned events of the one or more drilling activities that are not in the plan that caused the one or more deviations, calculating a contribution to the difference between the actual value and the planned value caused by the one or more unplanned events, and modifying the drill plan to account for the one or more unplanned events.

It will be appreciated that this summary is intended merely to introduce some aspects of the present methods, systems, and media, which are more fully described and/or claimed below. Accordingly, this summary is not intended to be limiting.

BRIEF DESCRIPTION OF THE DRAWINGS

The accompanying drawings, which are incorporated in and constitute a part of this specification, illustrate embodiments of the present teachings and together with the description, serve to explain the principles of the present teachings. In the figures:

FIG. 2 illustrates a flowchart of a method for drilling a well, according to an embodiment.

DETAILED DESCRIPTION

Reference will now be made in detail to embodiments, examples of which are illustrated in the accompanying drawings and figures. In the following detailed description, numerous specific details are set forth in order to provide a thorough understanding of the invention. However, it will be apparent to one of ordinary skill in the art that the invention may be practiced without these specific details. In other instances, well-known methods, procedures, components, circuits, and networks have not been described in detail so as not to unnecessarily obscure aspects of the embodiments.

It will also be understood that, although the terms first, second, etc. may be used herein to describe various elements, these elements should not be limited by these terms. These terms are only used to distinguish one element from another. For example, a first object or step could be termed a second object or step, and, similarly, a second object or step could be termed a first object or step, without departing from the scope of the present disclosure. The first object or step, and the second object or step, are both, objects or steps, respectively, but they are not to be considered the same object or step.

The terminology used in the description herein is for the purpose of describing particular embodiments and is not intended to be limiting. As used in this description and the appended claims, the singular forms "a," "an" and "the" are intended to include the plural forms as well, unless the context clearly indicates otherwise. It will also be understood that the term "and/or" as used herein refers to and encompasses any possible combinations of one or more of the associated listed items. It will be further understood that the terms "includes," "including," "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Further, as used herein, the term "if" may be construed to mean "when" or "upon" or "in response to determining" or "in response to detecting," depending on the context.

Attention is now directed to processing procedures, methods, techniques, and workflows that are in accordance with some embodiments. Some operations in the processing procedures, methods, techniques, and workflows disclosed herein may be combined and/or the order of some operations may be changed.

Figure 1:
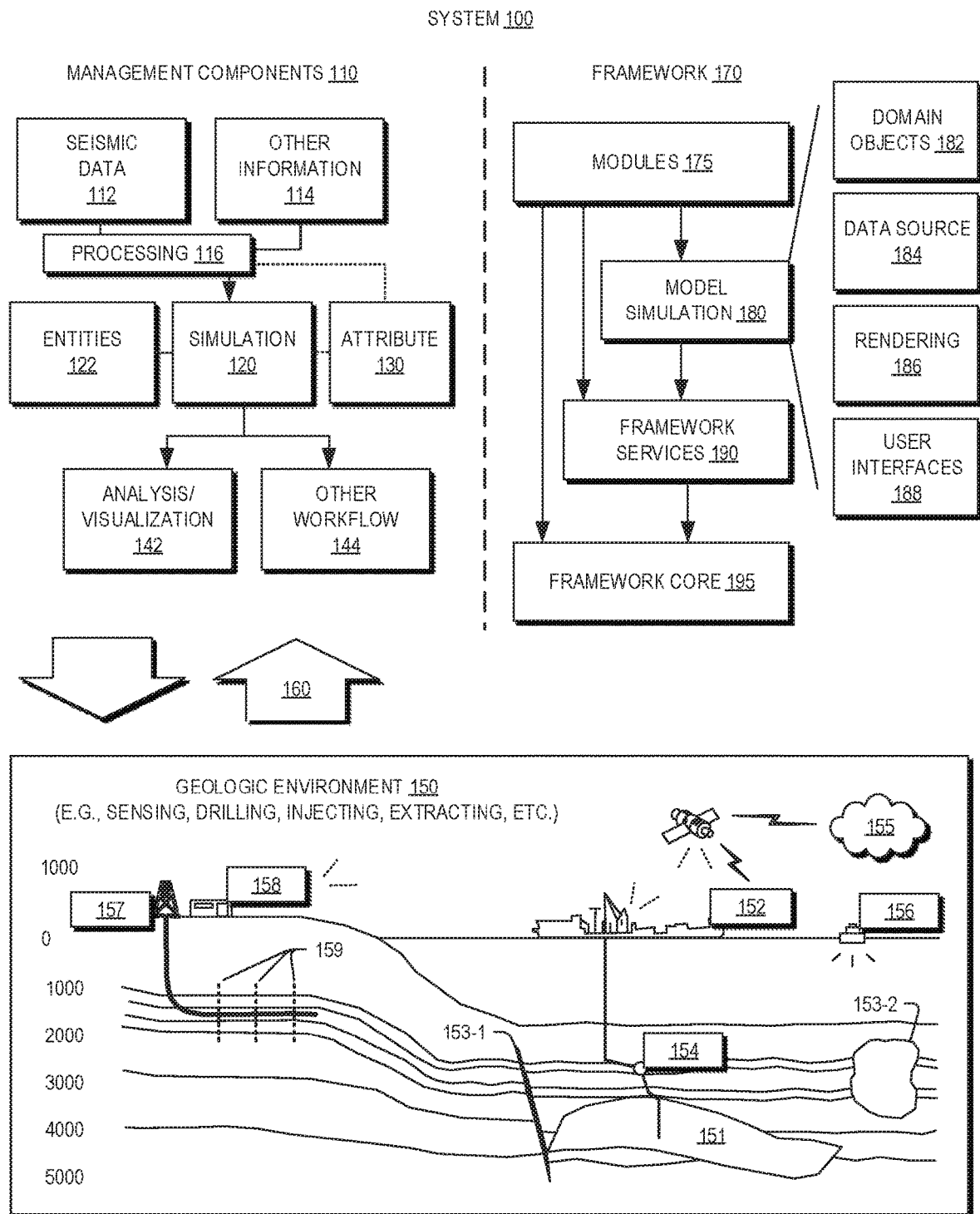
FIG. 1 illustrates an example of a system that includes various management components to manage various aspects of a geologic environment, according to an embodiment.

FIG. 1 illustrates an example of a system 100 that includes various management components 110 to manage various aspects of a geologic environment 150 (e.g., an environment that includes a sedimentary basin, a reservoir 151, one or more faults 153-1, one or more geobodies 153-2, etc.). For example, the management components 110 may allow for direct or indirect management of sensing, drilling, injecting, extracting, etc., with respect to the geologic environment 150. In turn, further information about the geologic environment 150 may become available as feedback 160 (e.g., optionally as input to one or more of the management components 110).

In the example of FIG. 1, the management components 110 include a seismic data component 112, an additional information component 114 (e.g., well/logging data), a processing component 116, a simulation component 120, an attribute component 130, an analysis/visualization component 142 and a workflow component 144. In operation, seismic data and other information provided per the components 112 and 114 may be input to the simulation component 120.

In an example embodiment, the simulation component 120 may rely on entities 122. Entities 122 may include earth entities or geological objects such as wells, surfaces, bodies, reservoirs, etc. In the system 100, the entities 122 can include virtual representations of actual physical entities that are reconstructed for purposes of simulation. The entities 122 may include entities based on data acquired via sensing, observation, etc. (e.g., the seismic data 112 and other information 114). An entity may be characterized by one or more properties (e.g., a geometrical pillar grid entity of an earth model may be characterized by a porosity property). Such properties may represent one or more measurements (e.g., acquired data), calculations, etc.

In an example embodiment, the simulation component 120 may operate in conjunction with a software framework such as an object-based framework. In such a framework, entities may include entities based on pre-defined classes to facilitate modeling and simulation. A commercially available example of an object-based framework is the MICROSOFT® .NET® framework (Redmond, Wash.), which provides a set of extensible object classes. In the .NET® framework, an object class encapsulates a module of reusable code and associated data structures. Object classes can be used to instantiate object instances for use in or by a program, script, etc. For example, borehole classes may define objects for representing boreholes based on well data.

In the example of FIG. 1, the simulation component 120 may process information to conform to one or more attributes specified by the attribute component 130, which may include a library of attributes. Such processing may occur prior to input to the simulation component 120 (e.g., consider the processing component 116). As an example, the simulation component 120 may perform operations on input information based on one or more attributes specified by the attribute component 130. In an example embodiment, the simulation component 120 may construct one or more models of the geologic environment 150, which may be relied on to simulate behavior of the geologic environment 150 (e.g., responsive to one or more acts, whether natural or artificial). In the example of FIG. 1, the analysis/visualization component 142 may allow for interaction with a model or model-based results (e.g., simulation results, etc.). As an example, output from the simulation component 120 may be input to one or more other workflows, as indicated by a workflow component 144.

As an example, the simulation component 120 may include one or more features of a simulator such as the ECLIPSE™ reservoir simulator (Schlumberger Limited, Houston Tex.), the INTERSECT™ reservoir simulator (Schlumberger Limited, Houston Tex.), etc. As an example, a simulation component, a simulator, etc. may include features to implement one or more meshless techniques (e.g., to solve one or more equations, etc.). As an example, a reservoir or reservoirs may be simulated with respect to one or more enhanced recovery techniques (e.g., consider a thermal process such as SAGD, etc.).

In an example embodiment, the management components 110 may include features of a commercially available framework such as the PETREL® seismic to simulation software framework (Schlumberger Limited, Houston, Tex.). The PETREL® framework provides components that allow for optimization of exploration and development operations. The PETREL® framework includes seismic to simulation software components that can output information for use in increasing reservoir performance, for example, by improving asset team productivity. Through use of such a framework, various professionals (e.g., geophysicists, geologists, and reservoir engineers) can develop collaborative workflows and integrate operations to streamline processes. Such a framework may be considered an application and may be considered a data-driven application (e.g., where data is input for purposes of modeling, simulating, etc.).

In an example embodiment, various aspects of the management components 110 may include add-ons or plug-ins that operate according to specifications of a framework environment. For example, a commercially available framework environment marketed as the OCEAN® framework environment (Schlumberger Limited, Houston, Tex.) allows for integration of add-ons (or plug-ins) into a PETREL® framework workflow. The OCEAN® framework environment leverages .NET® tools (Microsoft Corporation, Redmond, Wash.) and offers stable, user-friendly interfaces for efficient development. In an example embodiment, various components may be implemented as add-ons (or plug-ins) that conform to and operate according to specifications of a framework environment (e.g., according to application programming interface (API) specifications, etc.).

FIG. 1 also shows an example of a framework 170 that includes a model simulation layer 180 along with a framework services layer 190, a framework core layer 195 and a modules layer 175. The framework 170 may include the commercially available OCEAN® framework where the model simulation layer 180 is the commercially available PETREL® model-centric software package that hosts OCEAN® framework applications. In an example embodiment, the PETREL® software may be considered a data-driven application. The PETREL® software can include a framework for model building and visualization.

As an example, a framework may include features for implementing one or more mesh generation techniques. For example, a framework may include an input component for receipt of information from interpretation of seismic data, one or more attributes based at least in part on seismic data, log data, image data, etc. Such a framework may include a mesh generation component that processes input information, optionally in conjunction with other information, to generate a mesh.

In the example of FIG. 1, the model simulation layer 180 may provide domain objects 182, act as a data source 184, provide for rendering 186 and provide for various user interfaces 188. Rendering 186 may provide a graphical environment in which applications can display their data while the user interfaces 188 may provide a common look and feel for application user interface components.

As an example, the domain objects 182 can include entity objects, property objects and optionally other objects. Entity objects may be used to geometrically represent wells, surfaces, bodies, reservoirs, etc., while property objects may be used to provide property values as well as data versions and display parameters. For example, an entity object may represent a well where a property object provides log information as well as version information and display information (e.g., to display the well as part of a model).

In the example of FIG. 1, data may be stored in one or more data sources (or data stores, generally physical data storage devices), which may be at the same or different physical sites and accessible via one or more networks. The model simulation layer 180 may be configured to model projects. As such, a particular project may be stored where stored project information may include inputs, models, results and cases. Thus, upon completion of a modeling session, a user may store a project. At a later time, the project can be accessed and restored using the model simulation layer 180, which can recreate instances of the relevant domain objects.

In the example of FIG. 1, the geologic environment 150 may include layers (e.g., stratification) that include a reservoir 151 and one or more other features such as the fault 153-1, the geobody 153-2, etc. As an example, the geologic environment 150 may be outfitted with any of a variety of sensors, detectors, actuators, etc. For example, equipment 152 may include communication circuitry to receive and to transmit information with respect to one or more networks 155. Such information may include information associated with downhole equipment 154, which may be equipment to acquire information, to assist with resource recovery, etc. Other equipment 156 may be located remote from a well site and include sensing, detecting, emitting or other circuitry. Such equipment may include storage and communication circuitry to store and to communicate data, instructions, etc. As an example, one or more satellites may be provided for purposes of communications, data acquisition, etc. For example, FIG. 1 shows a satellite in communication with the network 155 that may be configured for communications, noting that the satellite may additionally or instead include circuitry for imagery (e.g., spatial, spectral, temporal, radiometric, etc.).

FIG. 1 also shows the geologic environment 150 as optionally including equipment 157 and 158 associated with a well that includes a substantially horizontal portion that may intersect with one or more fractures 159. For example, consider a well in a shale formation that may include natural fractures, artificial fractures (e.g., hydraulic fractures) or a combination of natural and artificial fractures. As an example, a well may be drilled for a reservoir that is laterally extensive. In such an example, lateral variations in properties, stresses, etc. may exist where an assessment of such variations may assist with planning, operations, etc. to develop a laterally extensive reservoir (e.g., via fracturing, injecting, extracting, etc.). As an example, the equipment 157 and/or 158 may include components, a system, systems, etc. for fracturing, seismic sensing, analysis of seismic data, assessment of one or more fractures, etc.

As mentioned, the system 100 may be used to perform one or more workflows. A workflow may be a process that includes a number of worksteps. A workstep may operate on data, for example, to create new data, to update existing data, etc. As an example, a workflow may operate on one or more inputs and create one or more results, for example, based on one or more algorithms. As an example, a system may include a workflow editor for creation, editing, executing, etc. of a workflow. In such an example, the workflow editor may provide for selection of one or more pre-defined worksteps, one or more customized worksteps, etc. As an example, a workflow may be a workflow implementable in the PETREL® software, for example, that operates on seismic data, seismic attribute(s), etc. As an example, a workflow may be a process implementable in the OCEAN® framework. As an example, a workflow may include one or more worksteps that access a module such as a plug-in (e.g., external executable code, etc.).

FIG. 2 illustrates a flowchart of a method 200 for conducting oilfield operations according to a plan, according to an embodiment. In the present disclosure, the method 200 is described with respect to drilling operations; however, it will be appreciated that embodiments of the method 200 may be applied to other types of oilfield operations and activities associated therewith.

The method 200 may include obtaining a drill plan, as at 202. Obtaining the drill plan may include constructing the drill plan, e.g., using drill plans previously employed for other (e.g., offset) wells. The selection of such prior-constructed plans may be made according to a variety of factors, including the proximity of the offset well, the similarity of the characteristics (e.g., geometry, trajectory, etc.) of the offset well, the similarity of the formation characteristics, and the like. In addition, templates for drilling various types of wells may be used to construct the drill plan. In other embodiments, the drill plan may be pre-existing with respect to the method 200, and may be received and employed (and/or modified) from a library of drill plans, from a third-party vendor, or the like.

The drill plan may include many elements. For example, the drill plan may specify equipment characteristics, wellbore geometry, trajectory, etc. The drill plan may also include various actions and sequences thereof, which may be associated with wellbore depth or the like. For example, the well plan may specify when to drill, when to perform casing operations, when to steer the drilling equipment and in what direction, etc.

The drill plan may also specify a metric that may be used later to determine deviations from the well plan. For example, the metric may be time (i.e., duration) that the well as a total took, or that it took to reach various stages, reach certain milestones, conduct specific activities, etc. For example, a time may be specified between drilling from a certain depth to drilling to another depth. This is referred to as a "planned" value for the metric, as it represents what the drill plan specifies, but may not reflect what actually happens when drilling the well. Another example metric that could be used, e.g., in lieu of or in addition to time, is cost. Thus, a particular cost may be specified to drill all or a portion of the well. Various other metrics are within the scope of the present disclosure, with the aforementioned two being merely examples, unless stated otherwise herein.

The method 200 may then proceed to receiving data collected while performing actual, physical drilling activities for drilling a well using (that is, while at least attempting to follow) the drill plan, as at 204. The method 200 may not include the actual drilling process, but may be conducted by an operator or processor that is remote from the drilling operations, but receives data, e.g., from sensors, other operators, etc. that are involved with the physical drilling operations. In other embodiments, the method 200 may include drilling and thus contemporaneous acquisition of data related to such drilling.

The data received at 204 may include data representing (e.g., specifying or allowing calculation of) an actual value for the metric. Thus, the time or cost values, for example, may be reported, or sufficient information provided to enable a calculation thereof may be received, e.g., by a processor used to perform at least a portion of the method 200. The data received may also specify other things beyond the metric, such as well logs, formation information, etc.

Based on the data that represents the actual value for the metric, one or more deviations from the well plan may be determined, as at 206. For example, if the metric is time to conduct an activity (e.g., drill a portion of the well), the actual time spent may not match the planned time, thus indicating that something unexpected happened. For example, a pipe may have been stuck, a drill bit may have worn out, an unexpected hazard may be encountered, etc. Likewise, if the metric is cost, when the actual cost varies from the planned cost, it may indicate that some unexpected condition (included within the definition of an unexpected event) was present. For example, more or heavier drilling mud was used, or a drill bit was replaced, or tools were damaged, or rig equipment rental fees exceeded the planned fees based, again, on an activity taking longer than expected, etc. The deviations may also be advantageous, e.g., lower cost or shorter duration than expected. These may be caused by equipment lasting longer than expected, conditions in the formation being more favorable than expected, etc.

Having determined that a deviation exists, the method 200 may proceed to identifying the cause, e.g., the one or more unplanned events mentioned above, as at 208. The unplanned events may be evident from the drilling activity log, which may be kept by the drilling operator and provided to the processor executing at least a portion of the method 200. In some embodiments, other data may be employed to determine the cause of the unplanned events. In some embodiments, artificial intelligence (AI), e.g., a neural network, may be employed to review the drilling data, e.g., in response to determining that a deviation from the well plan is present, to identify the root cause, that is, the unplanned event.

Now having determined at least one cause of the deviation (an unplanned event), the method 200 may proceed to calculating a contribution to the difference (or deviation) between the actual and the planned value that is attributable to the one or more unplanned events, as at 210. Again, this may be conducted by an AI system trained to link identified, unplanned events to the metric.

The method 200 may then proceed to modifying the drill plan to account for such unplanned events for use in subsequent drilling operations, as at 212. For example, the method 200 may adjust one or more drilling parameters, e.g., in an effort to avoid the unplanned event and/or mitigate the effect of (e.g., reduce the deviation from the planned metric caused by) the unplanned event. Additionally or alternatively, the method 200 may adjust the metric to reflect the actual (or may trend the metric closer to the actual), e.g., in the case that the unplanned event cannot, or cannot cost-effectively, be avoided. The drill plan may also be modified to incorporate the unplanned event into the drilling activities that are part of the drill plan, effectively reclassifying the event from unplanned to planned.

Thus, to relate the method 200 to a specific example, consider the unplanned event as a drill bit wearing out before expected, which led to the bottom hole assembly being pulled out of the hole, switched/reconditioned, and then run back in. If the metric is time, these activities related to the unplanned event will show up as deviations from the planned metric, i.e., it took longer to drill the (or the section of the) well than expected. The AI may then review the drilling log and identify these activities as being unplanned. The AI may also identify the cause of these activities as the unplanned event (i.e., the drill bit wore out), or may simply consider the activities themselves as the unplanned event. The AI may then calculate the amount of time attributable to the unplanned event. It will be appreciated that there may be multiple unplanned events that lead to such deviations in the metric, and thus the AI may be able to allocate such deviation among the different unplanned events, so that drilling operators can recognize what were the primary contributing factors to the deviations. The AI may also modify the drill plan for the next use, e.g., by specifying mitigating actions as part of the drill plan, or modifying the drill plan to incorporate, for example, a recognition that the drill bit will wear out and build that cost (in terms of time, money, etc.) into the metric.

In some embodiments, the method 200 may also display various data related to worksteps discussed herein. For example, the method 200 may display data representing the metric, deviations therefrom, the root causes of the deviations, their contribution to the deviations, and any mitigating actions suggested. Additional details about an example of such a visualization are provided below.

Figure 3:
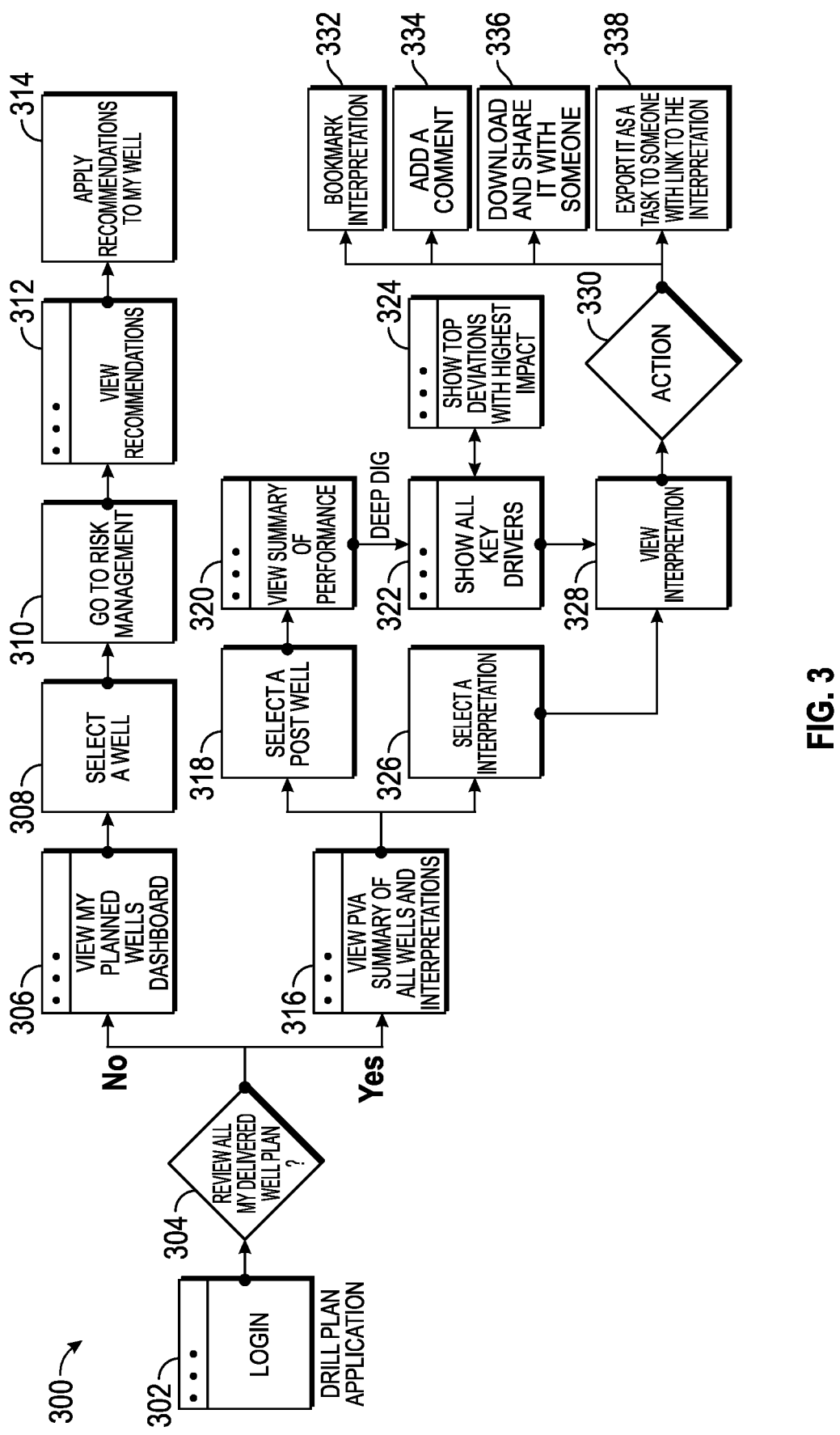
FIG. 3 illustrates a flowchart of a method for visualizing a drill plan in comparison to actual drilling data, according to an embodiment.

FIG. 3 illustrates a flowchart of a method 300 for visualizing a drill plan in comparison to actual drilling data, according to an embodiment. The method 300 may be performed as part of the method 200 discussed above with reference to FIG. 2.

The method 300 may include a portal for a user, and thus may begin by a user logging in, as at 302. In the portal, the user may have multiple selections of data to view, e.g., whether to view all or some delivered well plans, as at 304. Beginning with the upper branch from 304, if the user chooses not to review all delivered well plans, a dashboard of well plans to select from, as at 306. The user may then select a well, as at 308, go to risk management, as at 310, and view recommendations, as at 312. The recommendations may include modifications to the drill plan, whether received from artificial intelligence, from another member of a collaborative well-planning team, or in response to data acquired while drilling another well. The method 300 may then give the user the ability to apply such recommendations to the well plans, as at 314.

Referring to the lower branch from 304, the method 300 may proceed to viewing a summary of the wells and interpretations, as at 316. The method may then proceed to allowing selection of a post well (a well already drilled), as at 318, and viewing a summary of the performance of the well plan, as at 320. This summary may, for example, include a visual depiction of the metric, and show the extent to which any deviations therefrom were calculated. A user may choose to review in greater detail, and thus the method 300 may proceed to showing the "drivers", as at 322. The drivers shown at 322 may be the unplanned events and/or activities resulting therefrom that resulted in the deviation from the metric. The drivers may be ranked, and the "top" (those with the greatest deviation associated therewith) may be shown first, as at 324.

The method 300 may also allow a user to select an interpretation, as at 326, and view an interpretation, as at 328. The interpretation may give an analysis of what caused the deviations from the plan. For example, if more time was spent to drill a section of the well due to bit wear, the interpretation may provide an automated analysis of drivers behind this deviation from plan, e.g., bottom hole assembly design, mechanics, dynamics, etc., which may be presented graphically for a user and used to determine a cause of an unplanned event. Each driver may be presented in a different way so that it shows comparison of expected values and benchmark versus actual recorded data.

In other words, the interpretations can include determining the impact and cause of events with the help of drivers (e.g., the causes of the deviations), and potentially also providing recommendations to the user. The interpretations may also sort the events by time, cost etc. The user may also manipulate the drivers and explore the details about the root cause(s).

The interpretations may provide the user with visualizations of the drivers and a description of the event, cause, and the recommendation. It also provides the ability for the user to save, comment, and share the interpretations so that one can export it as a task that can be assigned.

The user may then choose an action, as at 330. For example, the user may bookmark an interpretation, as at 332, add a comment, as at 334, download a plan and share it, as at 336, or export the interpretation as a task for someone to handle, as at 338.

Figure 4:
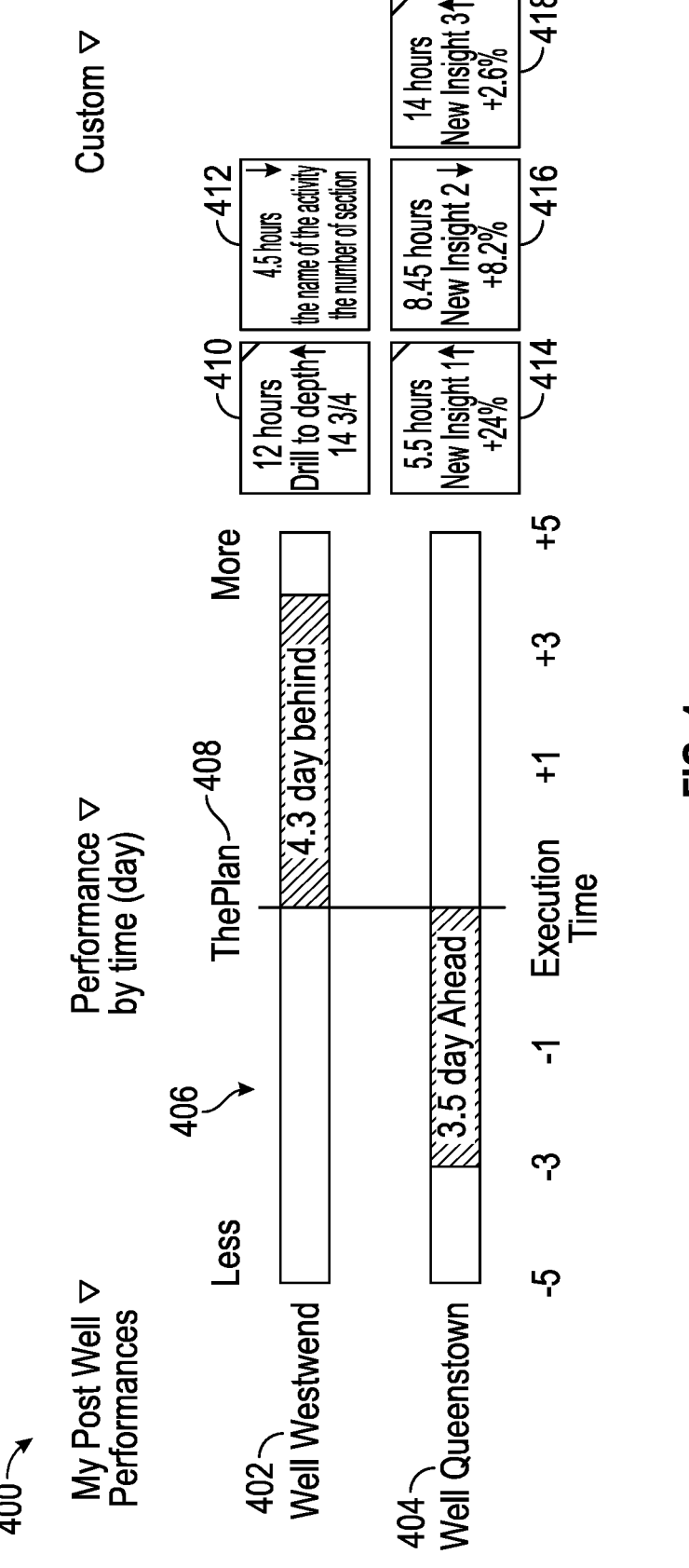
FIG. 4 illustrates a dashboard that may be used to display outputs from embodiments of the methods, according to an embodiment.

FIG. 4 illustrates a dashboard 400 that may be used to display the planned versus the actual metric values, according to an embodiment. This particular example illustrates two wells, 402, 404. A bar graph 406 illustrates the deviations, with the planned value being represented in the middle, as indicated at 408. This example uses time as the metric, which is indicated on the horizontal axis. The well 402 was finished behind schedule by 4.3 days, and thus is in the positive (greater than zero) side. The causes (or at least the largest causes) of the deviation are shown in selectable boxes 410, 412, along with the deviation value attributable thereto (e.g., in time). By contrast, the well 404 was finished ahead of schedule (negative deviation), and drivers of such deviation as also shown as selectable boxes 414, 416, 418.

Figure 5:
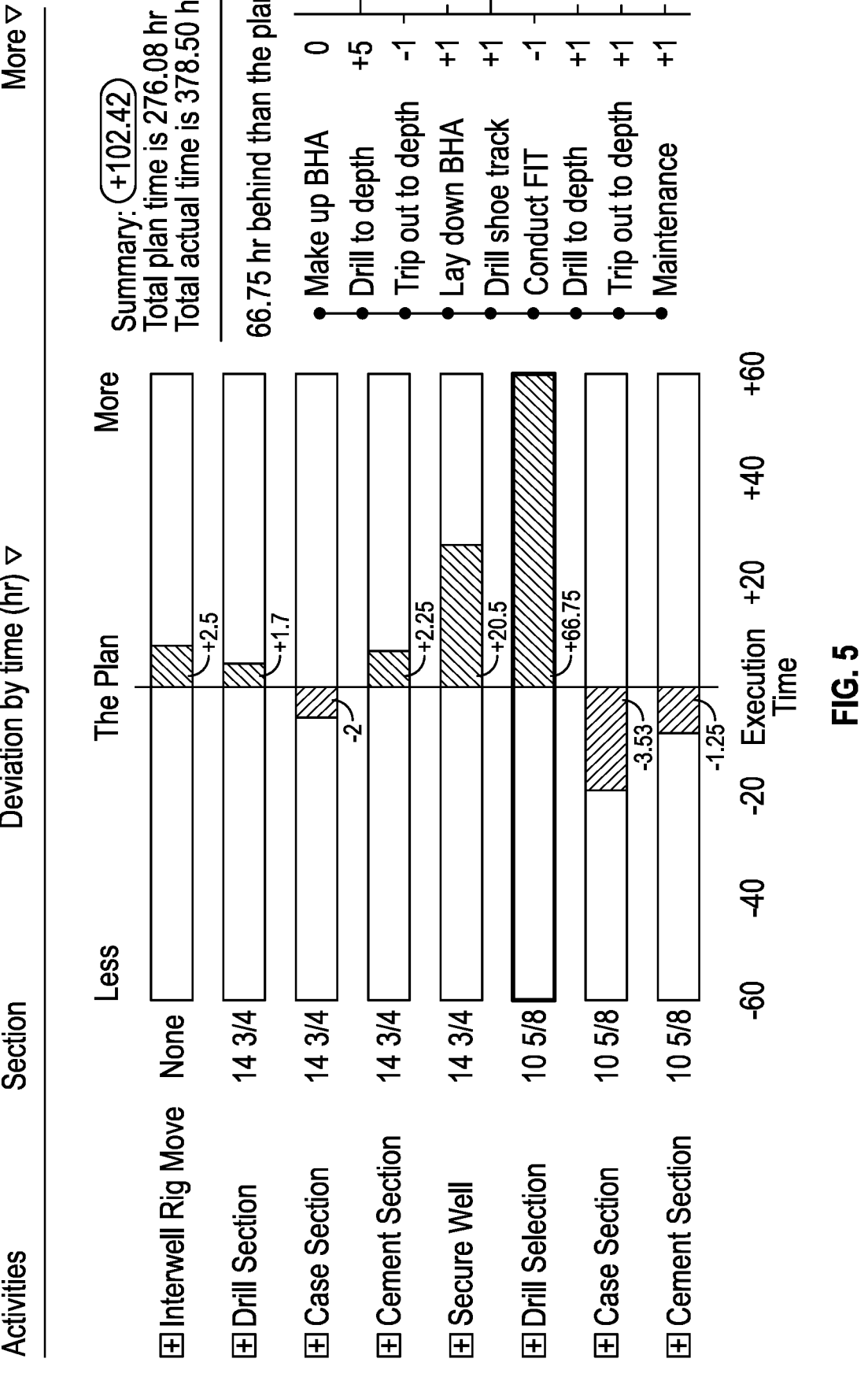
FIG. 5 illustrates a deviations display, which emphasizes deviations (+/−) from related points in a detailed view, according to an embodiment.

FIG. 5 illustrates a deviations display, which emphasizes deviations (+/−) from related points in a detailed view, e.g., for an individual well, according to an embodiment. Thus, for example, a user may select one of the wells 402, 404 for more in-depth analysis, and the deviations display of FIG. 5 may be shown, thereby providing more granular detail as to the cause of the deviations, the identification of unplanned events, etc.

Figure 6:
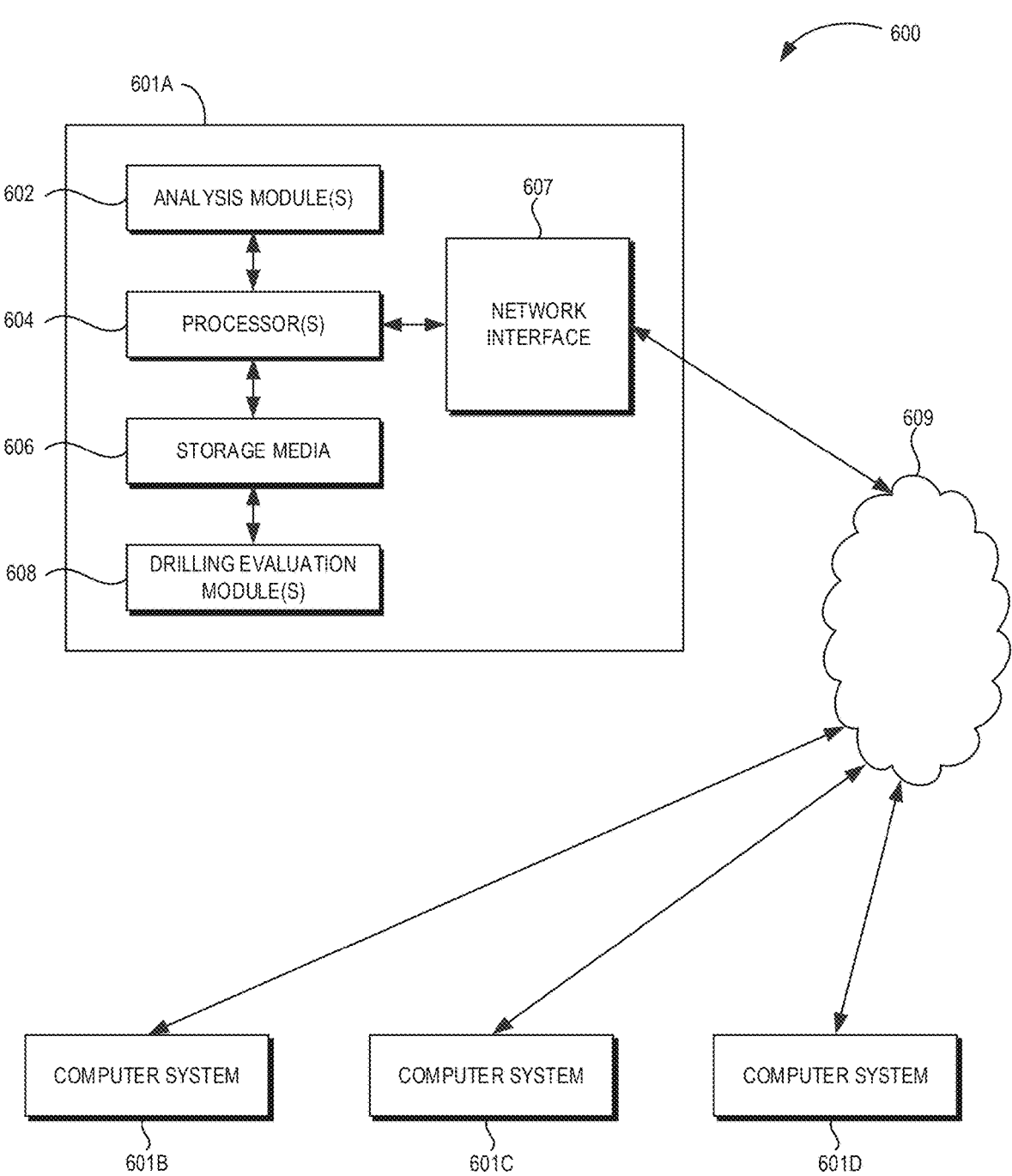
FIG. 6 illustrates a schematic view of a computing system, according to an embodiment.

In some embodiments, the methods of the present disclosure may be executed by a computing system. FIG. 6 illustrates an example of such a computing system 600, in accordance with some embodiments. The computing system 600 may include a computer or computer system 601A, which may be an individual computer system 601A or an arrangement of distributed computer systems. The computer system 601A includes one or more analysis modules 602 that are configured to perform various tasks according to some embodiments, such as one or more methods disclosed herein. To perform these various tasks, the analysis module 602 executes independently, or in coordination with, one or more processors 604, which is (or are) connected to one or more storage media 606. The processor(s) 604 is (or are) also connected to a network interface 607 to allow the computer system 601A to communicate over a data network 609 with one or more additional computer systems and/or computing systems, such as 601B, 601C, and/or 601D (note that computer systems 601B, 601C and/or 601D may or may not share the same architecture as computer system 601A, and may be located in different physical locations, e.g., computer systems 601A and 601B may be located in a processing facility, while in communication with one or more computer systems such as 601C and/or 601D that are located in one or more data centers, and/or located in varying countries on different continents).

A processor may include a microprocessor, microcontroller, processor module or subsystem, programmable integrated circuit, programmable gate array, or another control or computing device.

The storage media 606 may be implemented as one or more computer-readable or machine-readable storage media. Note that while in the example embodiment of FIG. 6 storage media 606 is depicted as within computer system 601A, in some embodiments, storage media 606 may be distributed within and/or across multiple internal and/or external enclosures of computing system 601A and/or additional computing systems. Storage media 606 may include one or more different forms of memory including semiconductor memory devices such as dynamic or static random access memories (DRAMs or SRAMs), erasable and programmable read-only memories (EPROMs), electrically erasable and programmable read-only memories (EEPROMs) and flash memories, magnetic disks such as fixed, floppy and removable disks, other magnetic media including tape, optical media such as compact disks (CDs) or digital video disks (DVDs), BLURAY® disks, or other types of optical storage, or other types of storage devices. Note that the instructions discussed above may be provided on one computer-readable or machine-readable storage medium, or may be provided on multiple computer-readable or machine-readable storage media distributed in a large system having possibly plural nodes. Such computer-readable or machine-readable storage medium or media is (are) considered to be part of an article (or article of manufacture). An article or article of manufacture may refer to any manufactured single component or multiple components. The storage medium or media may be located either in the machine running the machine-readable instructions, or located at a remote site from which machine-readable instructions may be downloaded over a network for execution.

In some embodiments, computing system 600 contains one or more drilling evaluation module(s) 608. In the example of computing system 600, computer system 601A includes the drilling evaluation module 608. In some embodiments, a single drilling evaluation module may be used to perform some aspects of one or more embodiments of the methods disclosed herein. In other embodiments, a plurality of drilling evaluation modules may be used to perform some aspects of methods herein.

It should be appreciated that computing system 600 is merely one example of a computing system, and that computing system 600 may have more or fewer components than shown, may combine additional components not depicted in the example embodiment of FIG. 6, and/or computing system 600 may have a different configuration or arrangement of the components depicted in FIG. 6. The various components shown in FIG. 6 may be implemented in hardware, software, or a combination of both hardware and software, including one or more signal processing and/or application specific integrated circuits.

Further, the steps in the processing methods described herein may be implemented by running one or more functional modules in information processing apparatus such as general purpose processors or application specific chips, such as ASICs, FPGAs, PLDs, or other appropriate devices. These modules, combinations of these modules, and/or their combination with general hardware are included within the scope of the present disclosure.

Computational interpretations, models, and/or other interpretation aids may be refined in an iterative fashion; this concept is applicable to the methods discussed herein. This may include use of feedback loops executed on an algorithmic basis, such as at a computing device (e.g., computing system 600, FIG. 6), and/or through manual control by a user who may make determinations regarding whether a given step, action, template, model, or set of curves has become sufficiently accurate for the evaluation of the subsurface three-dimensional geologic formation under consideration.

The foregoing description, for purpose of explanation, has been described with reference to specific embodiments. However, the illustrative discussions above are not intended to be exhaustive or limiting to the precise forms disclosed. Many modifications and variations are possible in view of the above teachings. Moreover, the order in which the elements of the methods described herein are illustrated and described may be re-arranged, and/or two or more elements may occur simultaneously. The embodiments were chosen and described in order to best explain the principles of the disclosure and its practical applications, to thereby enable others skilled in the art to best utilize the disclosed embodiments and various embodiments with various modifications as are suited to the particular use contemplated.

What is claimed is:

1. A method for conducting an oilfield operation, the method comprising:

obtaining a drill plan for conducting an oilfield operation at an oilfield, the drill plan comprising a planned value for a metric and planned drilling parameters including a plurality of planned drilling parameter values;

drilling a first well using the drill plan using equipment located at the oilfield including at least one sensor acquiring data that is transmitted via one or more networks, the equipment performing one or more oilfield activities at the first well using the drill plan;

receiving the data via the one or more networks, the data being collected while the equipment was performing the one or more oilfield activities at the first well using the drill plan, at least a portion of the data representing an actual value for the metric;

determining that one or more deviations from the drill plan occurred based on a difference between the actual value and the planned value;

identifying, automatically using an artificial intelligence, one or more unplanned events of the one or more oilfield activities that are not in the drill plan that caused the one or more deviations;

calculating, by the artificial intelligence, a contribution to the difference between the actual value and the planned value caused by the one or more unplanned events, the artificial intelligence being trained to link unplanned events to the metric;

modifying the drill plan to generate a modified plan comprising modified drilling parameters comprising a plurality of planned drilling parameter values, at least one modified drilling parameter value being different from a corresponding planned drilling parameter value among the plurality of planned drilling parameter values, the modified plan being configured to manage the one or more unplanned events, the modifying the drill plan comprising at least one of:

determining the modified drilling parameters by adjusting one or more of the planned drilling parameters to:

avoid the one or more unplanned events;

mitigate an effect of the one or more unplanned events; or reduce the difference between the actual value and the planned value caused by the one or more unplanned events;

adjusting the metric to be the actual value or to trend the metric closer to the actual value; or incorporating the one or more unplanned events into the drill plan;

transmitting the modified plan to the equipment at the oilfield via the one or more networks; and drilling a second well at the oilfield with the equipment using the modified drilling parameters of the modified plan including the at least one modified drilling parameter value that is different from the corresponding planned drilling parameter value.

2. The method of claim 1, wherein:

the drill plan comprises a drilling plan; and the oilfield operation at least partially comprises drilling the first well.

3. The method of claim 1, wherein the metric comprises a time duration to finish the oilfield operation.

4. The method of claim 3, wherein the calculating the contribution comprises determining an amount of time spent conducting the one or more unplanned events.

5. The method of claim 1, wherein the metric comprises a cost to finish drilling at least a portion of the first well.

6. The method of claim 1, wherein the modifying the drill plan further comprises proposing a remedial action to reduce the deviation in subsequent oilfield operations.

7. The method of claim 1, wherein:

the one or more unplanned events comprise one or more drilling activities that were not part of the drill plan; and each of the one or more drilling activities comprises a value associated with the metric.

8. The method of claim 1, further comprising displaying at least one of:

data representing an identification of the one or more unplanned events;

data representing the contribution to the difference caused by each of the one or more unplanned events; or data representing a suggested modification to the drill plan to mitigate the one or more deviations.

9. A non-transitory computer-readable medium storing instructions that, when executed by one or more processors of a computing system, cause the computing system to perform operations, the operations comprising:

obtaining a drill plan for conducting an oilfield operation at an oilfield, the drill plan comprising a planned value for a metric and planned drilling parameters including a plurality of planned drilling parameter values;

drilling a first well using the drill plan using equipment located at the oilfield including at least one sensor acquiring data that is transmitted via one or more networks, the equipment performing one or more oilfield activities at the first well using the drill plan;

receiving the data via the one or more networks, the data being collected while the equipment was performing the one or more oilfield activities at the first well using the drill plan, at least a portion of the data representing an actual value for the metric;

determining that one or more deviations from the drill plan occurred based on a difference between the actual value and the planned value;

identifying, automatically using an artificial intelligence, one or more unplanned events of the one or more oilfield activities that are not in the drill plan that caused the one or more deviations;

calculating, by the artificial intelligence, a contribution to the difference between the actual value and the planned value caused by the one or more unplanned events, the artificial intelligence being trained to link unplanned events to the metric;

modifying the drill plan to generate a modified plan comprising modified drilling parameters comprising a plurality of planned drilling parameter values, at least one modified drilling parameter value being different from a corresponding planned drilling parameter value among the plurality of planned drilling parameter values, the modified plan being configured to manage the one or more unplanned events, the modifying the drill plan comprising at least one of:

determining the modified drilling parameters by adjusting one or more of the planned drilling parameters to:

avoid the one or more unplanned events;

mitigate an effect of the one or more unplanned events; or reduce the difference between the actual value and the planned value caused by the one or more unplanned events;

adjusting the metric to be the actual value or to trend the metric closer to the actual value; or incorporating the one or more unplanned events into the drill plan;

transmitting the modified plan to the equipment at the oilfield via the one or more networks; and p1 drilling a second well at the oilfield with the equipment using the modified drilling parameters of the modified plan including the at least one modified drilling parameter value that is different from the corresponding planned drilling parameter value.

10. The medium of claim 9, wherein:

the drill plan comprises a drilling plan; and

the oilfield operation at least partially comprises drilling the first well.

11. The medium of claim 9, wherein the metric comprises a time duration to finish the oilfield operation, a cost to finish the oilfield operation, or both.

12. The medium of claim 11, wherein the calculating the contribution comprises determining an amount of time spent conducting the one or more unplanned events, or the cost associated therewith, or both.

13. The medium of claim 9, wherein the modifying the drill plan further comprises proposing a remedial action to reduce the one or more deviations in subsequent oilfield operations.

14. The medium of claim 9, wherein:

the one or more unplanned events comprise one or more drilling activities that were not part of the drill plan; and each of the one or more drilling activities comprises a value associated with the metric.

15. The medium of claim 9, further comprising displaying at least one of:

data representing an identification of the one or more unplanned events;

data representing the contribution to the difference caused by each of the one or more unplanned events; or data representing a suggested modification to the drill plan to mitigate the one or more deviations.

16. A computing system, comprising:

one or more processors; and a memory system comprising one or more non-transitory computer-readable media storing instructions that, when executed by at least one of the one or more processors, cause the computing system to perform operations, the operations comprising:

obtaining a drill plan for drilling a well at an oilfield, the drill plan comprising a planned value for a metric and planned drilling parameters including a plurality of planned drilling parameter values;

drilling a first well using the drill plan using equipment located at the oilfield including at least one sensor acquiring data that is transmitted via one or more networks, the equipment performing one or more oilfield activities at the first well using the drill plan;

receiving the data via the one or more networks, the data being collected while the equipment was performing the one or more oilfield activities at the first well using the drill plan, at least a portion of the data representing an actual value for the metric;

determining that one or more deviations from the drill plan occurred based on a difference between the actual value and the planned value;

identifying, automatically using an artificial intelligence, one or more unplanned events of the one or more oilfield activities that are not in the drill plan that caused the one or more deviations;

calculating, by the artificial intelligence, a contribution to the difference between the actual value and the planned value caused by the one or more unplanned events, the artificial intelligence being trained to link unplanned events to the metric;

modifying the drill plan to generate a modified plan comprising modified drilling parameters comprising a plurality of planned drilling parameter values, at least one modified drilling parameter value being different from a corresponding planned drilling parameter value among the plurality of planned drilling parameter values, the modified plan being configured to manage the one or more unplanned events, the modifying the drill plan comprising at least one of:

determining the modified drilling parameters by adjusting one or more of the planned drilling parameters to:

avoid the one or more unplanned events;

mitigate an effect of the one or more unplanned events; or reduce the difference between the actual value and the planned value caused by the one or more unplanned events;

adjusting the metric to be the actual value or to trend the metric closer to the actual value; or incorporating the one or more unplanned events into the drill plan;

transmitting the modified plan to the equipment at the oilfield via the one or more networks; and drilling a second well at the oilfield with the equipment using the modified drilling parameters of the modified plan including the at least one modified drilling parameter value that is different from the corresponding planned drilling parameter value.

17. The system of claim 16, wherein the metric comprises time, cost, or both.

18. The method of claim 1, wherein the drilling parameters include at least one of: equipment characteristics, wellbore geometry, wellbore trajectory, various actions or sequences associated with wellbore depth, when to drill, when to perform casing operations, when to steer the drilling equipment, or in what direction to steer the drilling equipment.

19. The method of claim 1, further comprising:

determining, as the modified plan, by the artificial intelligence, a plurality of optional plans, each of the optional plans comprising different options to manage the one or more unplanned events;

displaying the plurality of optional plans to a user for selection;

the user selecting one of the plurality of optional plans; and steering the drilling equipment to drill the second well using the modified drilling parameters of the selected one of the plurality of optional plans.

* * * * *